United States Patent
Yu et al.

(10) Patent No.: US 7,902,035 B2
(45) Date of Patent: Mar. 8, 2011

(54) SEMICONDUCTOR DEVICE HAVING MULTIPLE FIN HEIGHTS

(75) Inventors: Chen-Hua Yu, Hsin-Chu (TW); Chen-Nan Yeh, Hsi-Chih (TW); Yu-Rung Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/484,911

(22) Filed: Jun. 15, 2009

(65) Prior Publication Data

US 2009/0253266 A1 Oct. 8, 2009

Related U.S. Application Data

(63) Continuation of application No. 11/741,580, filed on Apr. 27, 2007, now Pat. No. 7,560,785.

(51) Int. Cl.
*H01L 21/76* (2006.01)

(52) U.S. Cl. ... 438/424; 438/427; 438/445; 257/E21.035

(58) Field of Classification Search ............... 438/424, 438/427, 445; 257/E21.035
See application file for complete search history.

(56) References Cited

U.S. PATENT DOCUMENTS

| | | | |
|---|---|---|---|
| 6,252,284 B1 | 6/2001 | Muller et al. | |
| 6,413,802 B1 | 7/2002 | Hu et al. | |
| 6,642,090 B1 | 11/2003 | Fried et al. | |
| 6,706,571 B1 | 3/2004 | Yu et al. | |
| 6,858,478 B2 | 2/2005 | Chau et al. | |
| 6,909,147 B2 | 6/2005 | Aller et al. | |
| 7,190,050 B2 | 3/2007 | King et al. | |
| 7,196,380 B2 | 3/2007 | Anderson et al. | |
| 7,247,887 B2 | 7/2007 | King et al. | |
| 7,256,078 B2 | 8/2007 | Anderson et al. | |
| 7,256,464 B2 * | 8/2007 | Liao et al. | 257/401 |
| 7,265,008 B2 | 9/2007 | King et al. | |
| 7,382,020 B2 | 6/2008 | Liu et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,612,405 B2 * | 11/2009 | Yu et al. | 257/328 |
| 2004/0052948 A1 | 3/2004 | Gronbeck et al. | |
| 2005/0153490 A1 | 7/2005 | Yoon et al. | |
| 2006/0088967 A1 | 4/2006 | Hsiao et al. | |
| 2006/0234456 A1 | 10/2006 | Anderson et al. | |
| 2006/0270181 A1 | 11/2006 | Sandhu et al. | |
| 2007/0099353 A1 | 5/2007 | Thean et al. | |

(Continued)

OTHER PUBLICATIONS

Doyle, B.S., et al., "High Performance Fully-Depleted Tri-Gate CMOS Transistors," IEEE Electron Device Letters, vol. 24, No. 4, Apr. 2003, pp. 263-265.

(Continued)

*Primary Examiner* — Ngan Ngo
(74) *Attorney, Agent, or Firm* — Slater & Matsil, L.L.P.

(57) ABSTRACT

A semiconductor device having multiple fin heights is provided. Multiple fin heights are provided by using multiple masks to recess a dielectric layer within a trench formed in a substrate. In another embodiment, an implant mold or e-beam lithography are utilized to form a pattern of trenches in a photoresist material. Subsequent etching steps form corresponding trenches in the underlying substrate. In yet another embodiment, multiple masking layers are used to etch trenches of different heights separately. A dielectric region may be formed along the bottom of the trenches to isolate the fins by performing an ion implant and a subsequent anneal.

13 Claims, 15 Drawing Sheets

U.S. PATENT DOCUMENTS

| | | |
|---|---|---|
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0161171 A1 | 7/2007 | Burnett et al. |
| 2008/0006852 A1 | 1/2008 | Beintner et al. |
| 2008/0081420 A1* | 4/2008 | Kim .............................. 438/268 |
| 2008/0128797 A1 | 6/2008 | Dyer et al. |
| 2008/0230852 A1* | 9/2008 | Yu et al. ........................ 257/401 |
| 2008/0290470 A1 | 11/2008 | King et al. |
| 2008/0296632 A1 | 12/2008 | Moroz et al. |
| 2009/0181477 A1 | 7/2009 | King et al. |
| 2009/0209074 A1 | 8/2009 | Anderson et al. |
| 2010/0003802 A1* | 1/2010 | Kim .............................. 438/424 |
| 2010/0015778 A1 | 1/2010 | Lin et al. |
| 2010/0038679 A1 | 2/2010 | Chan et al. |

OTHER PUBLICATIONS

Shang, H., et al., "Investigation of FinFET devices for 32nm technologies and beyond," Symposium on VLSI Technology Digest of Technical Papers, 2006, 2 pgs.

* cited by examiner

SEMICONDUCTOR DEVICE HAVING MULTIPLE FIN HEIGHTS

This application is a continuation of U.S. patent application Ser. No. 11/741,580, entitled "Semiconductor Device Having Multiple Fin Heights," filed on Apr. 27, 2007 now U.S. Pat. No. 7,560,785, which application is incorporated herein by reference.

TECHNICAL FIELD

The present invention relates generally to semiconductor devices and, more particularly, to a structure of and method for forming semiconductor devices having multiple fin heights in a bulk semiconductor substrate.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-30 nm regime, approaches involving the use of fin field-effect transistors (finFETs) are being investigated to improve the short channel effects.

Generally, fins are produced by etching a trench in a silicon substrate and filling the trench with an oxide. The surface of the substrate is planarized and the oxide is recessed through etching to expose the silicon fin. A gate dielectric layer and a conductive gate layer are formed overlying the fins. This process, however, results in identical fin heights for each fin.

As a result, a structure of and method for forming semiconductor devices having different fin heights are needed.

SUMMARY OF THE INVENTION

These and other problems are generally solved or circumvented, and technical advantages are generally achieved, by preferred illustrative embodiments of the present invention which provide a strained-channel transistor with lattice-mismatched region.

In accordance with an embodiment of the present invention, a semiconductor device having fins of different heights is provided. A first fin and a second fin are formed in the bulk substrate such that each has a channel region with source/drain regions on opposing sides of the channel region, and such that the first fin has a different height than the second fin.

In accordance with yet another embodiment of the present invention, one or more first fins are formed between adjacent trenches of a first set of trenches, and one or more second fins are formed between adjacent trenches of a second set of trenches, wherein the first set of trenches have substantially the same depth as the second set of trenches. A dielectric material along a bottom of the first set of trenches has a thickness different than a dielectric material along a bottom of the second set of trenches.

In accordance with yet another embodiment of the present invention, a semiconductor device having fins of different heights is provided. The fins are located between adjacent trenches of varying depths, wherein a thickness of a dielectric material in trenches adjacent fins of a first height is substantially the same as dielectric material in trenches adjacent fins of a second height.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred illustrative embodiments are discussed in detail below. It should be appreciated, however, that the present invention provides many applicable inventive concepts that can be embodied in a wide variety of specific contexts. The specific illustrative embodiments discussed are merely illustrative of specific ways to make and use the invention, and do not limit the scope of the invention.

Embodiments of the present invention provide several improved methods for the formation of semiconductor devices and the resulting structures. These embodiments are discussed below in the context of forming finFET transistors having fins of different fin heights on a bulk silicon substrate. One of ordinary skill in the art will realize that embodiments of the present invention may be used with other configurations, such as, for example, omega-FETs or structures having three or more different fin heights.

Figure 1A:
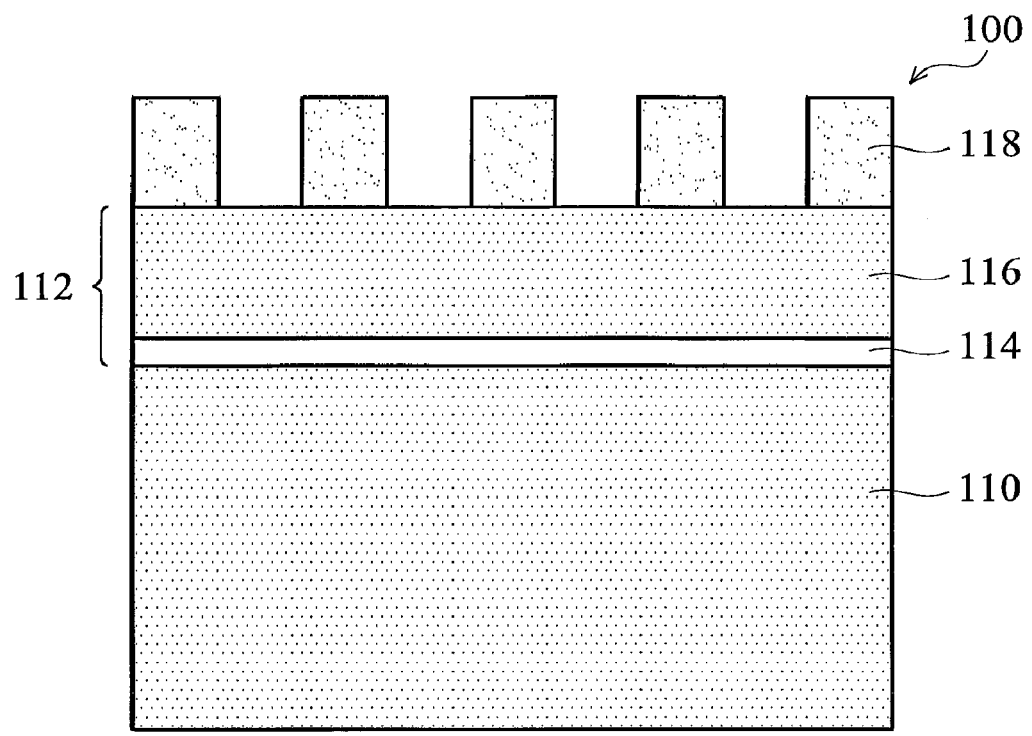
FIGS. 1a-1f are cross-section views of a wafer illustrating various process steps of forming fins having different fin heights in accordance with an embodiment of the present invention.

FIGS. 1a-1f illustrate a first method of forming a device 100 having multiple fin heights in accordance with an embodiment of the present invention. Referring first to FIG. 1a, a substrate 110 is provided with a hard mask 112 formed thereon. The substrate 110 may comprise any semiconductor material and may comprise known structures including a graded layer or a buried oxide, for example. In an embodiment, the substrate 110 comprises bulk silicon that may be undoped or doped (e.g., p-type, n-type, or a combination thereof). Other materials that are suitable for semiconductor device formation may be used. In a preferred embodiment, however, the substrate 110 is bulk silicon.

In an embodiment, the substrate 110 comprises a bulk silicon substrate having a thickness greater than about 500 µm, and more preferably between about 700 µm to about 800 µm, and a diameter greater than about 200 mm. A wafer such as this provides the mechanical strength during fabrication and may be ground to less than about 150 µm and diced to form an individual die.

The hard mask 112 is a protective layer to prevent the underlying structures, such as the substrate 110, from being removed during an etching process. One such suitable hard mask 112 comprises an oxide layer 114, such as a silicon oxide layer, and an overlying nitride layer 116, such as a silicon nitride ($Si_3N_4$) layer. The oxide layer 114 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. The oxide layer 114 may also be formed, for example, by an in-situ steam generation (ISSG) process in an ambient environment of $O_2$, $H_2O$, NO, a combination thereof, or the like. In an embodiment, the oxide layer 114 is about 50 Å to about 100 Å in thickness.

The nitride layer 116 may be formed using CVD techniques using silane and ammonia as precursor gases, and deposition temperatures ranging from 550° to 900° C. In an embodiment, the nitride layer 116 has a thickness from about 600 Å to about 1000 Å.

One of ordinary skill in the art will appreciate that other mask materials and/or structures may be used to form hard mask 112. For example, other materials, a single layer, three or more layers, or the like may be used. In an alternative embodiment, the hard mask may comprise a single silicon nitride layer without an underlying oxide layer.

Also illustrated in FIG. 1a is a first patterned mask 118. Generally, the first patterned mask 118, such as a photoresist mask, is formed on the hard mask 112 to pattern the hard mask 112 prior to patterning the underlying substrate 110. The first patterned mask 118 preferably comprises a photoresist material that has been masked, exposed, and developed. Generally, the photoresist material is deposited on the surface of the hard mask 112 and irradiated (exposed) and developed to remove a portion of the photoresist material, thereby exposing portions of the hard mask 112 as illustrated in FIG. 1a. The remaining photoresist material protects the underlying material from subsequent processing steps, such as etching.

Figure 1B:
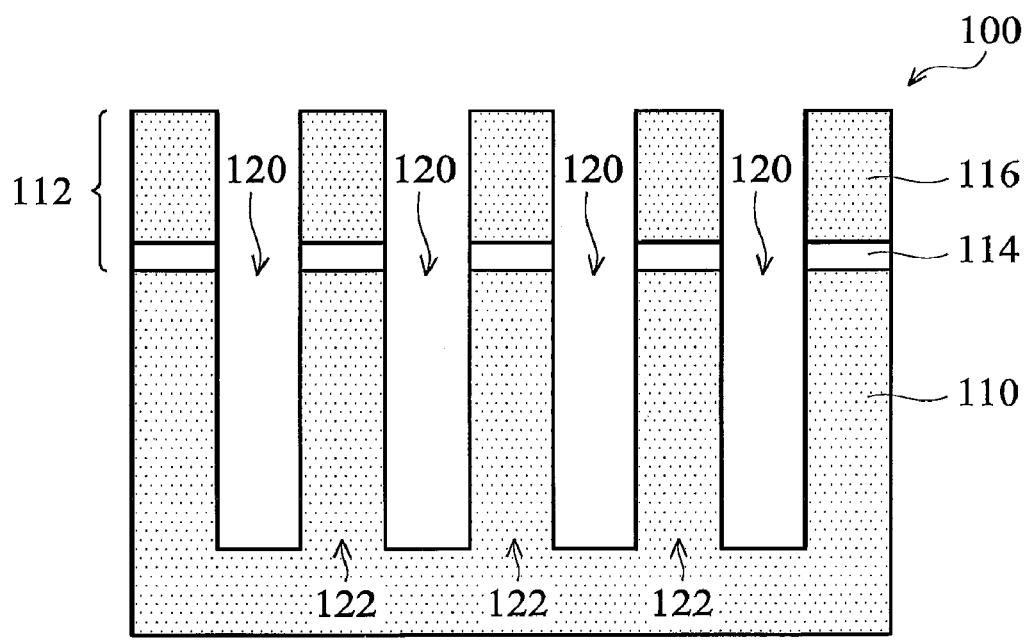

FIG. 1b illustrates the device 100 after the hard mask 112 and the substrate 110 have been patterned. The hard mask 112 and the substrate 110 may be patterned by performing one or more etching steps. For example, the nitride layer 116 may be etched using $CHF_3$ plasma, and the oxide layer 114 may be etched using $CF_4$ plasma.

Thereafter, exposed portions of the substrate 110 may be etched to form trenches 120 in the substrate 110 as illustrated in FIG. 1b. The substrate 110 may be etched by, for example, $HBr/O_2$, $HBr/Cl_2/O_2$, or $SF_6/Cl_2$ plasma. As will be discussed in greater detail below, the regions of the substrate between adjacent trenches 120 form fins 122. As one skilled in the art will appreciate, the depths of the trenches 120 will be substantially the same due to the simultaneous etching. In an embodiment, trenches 120 have a depth from about 2500 Å to about 3000 Å.

Also illustrated in FIG. 1b is the removal of the first patterned mask 118 (see FIG. 1a). The first patterned mask 118 may be removed, for example, by an $O_2$ plasma dry strip and a mixture of concentrated sulphuric acid and hydrogen peroxide.

Figure 1C:
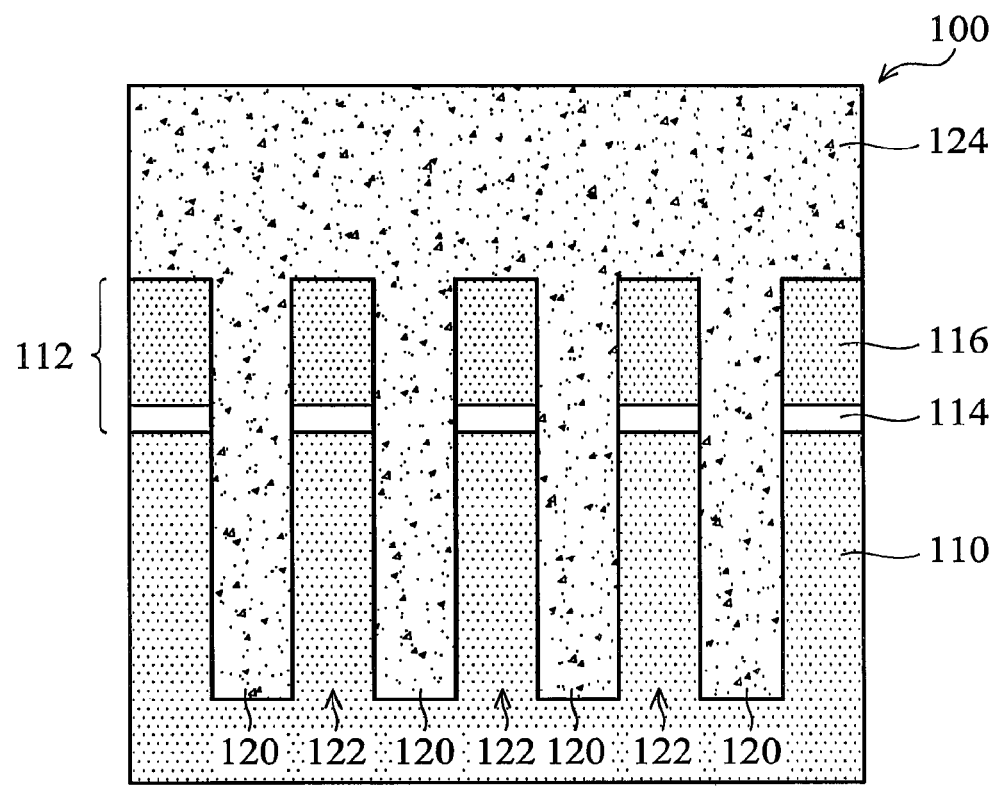

Referring now to FIG. 1c, a dielectric layer 124 is formed over the hard mask 112 and substantially filling the trenches 120. In an embodiment, the dielectric layer 124 comprises a silicon oxide layer that may be formed by a high-density plasma CVD deposition process using $SiH_4$ and $O_2$ mixture. In an embodiment, the dielectric layer 124 is about 6500 Å to about 7500 Å in thickness.

Figure 1D:
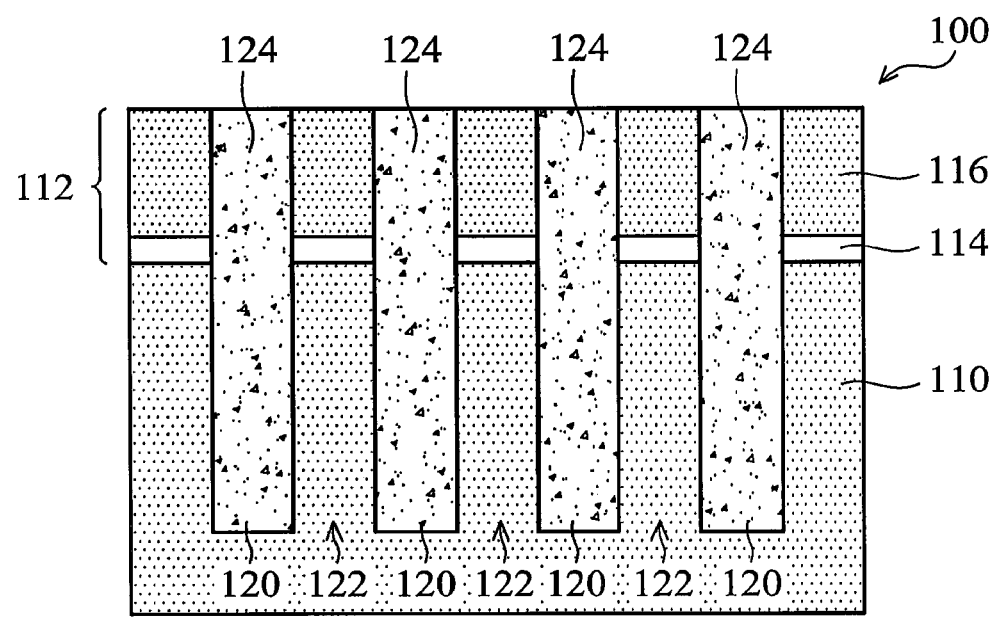
Figure 1E:
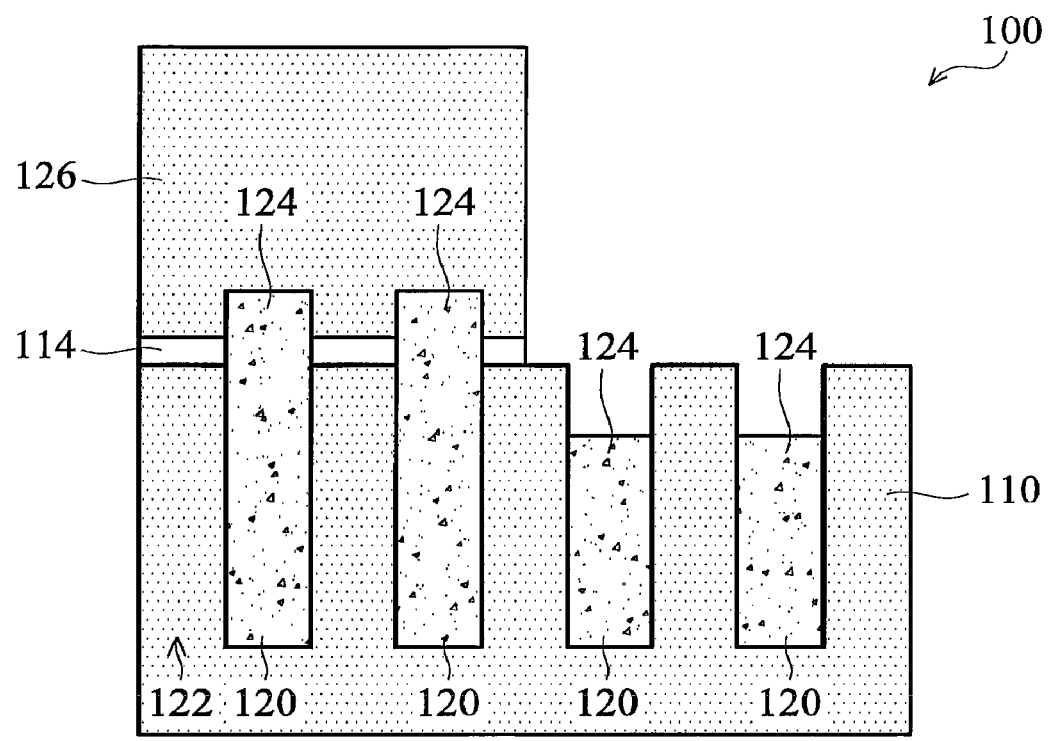

As illustrated in FIG. 1d, the dielectric layer 124 is planarized to a top surface of the hard mask 112 in accordance with an embodiment of the present invention. The dielectric layer 124 may be planarized, for example, by using a chemical-mechanical polishing (CMP) process using an oxide slurry wherein the hard mask 112 acts as a stop layer. In an embodiment, the nitride layer 116 of the hard mask 112 is removed after planarizing the dielectric layer 124, as illustrated in FIG. 1e. The nitride layer 116 may be removed using a wet dip in a solution of phosphoric acid.

FIG. 1e illustrates the device 100 of FIG. 1d after a second patterned mask 126 has been formed and patterned in accordance with an embodiment of the present invention. The second patterned mask 126 may be formed of similar materials and in a similar manner as described above with reference to the first patterned mask 118, except that the second patterned mask 126 is patterned such that portions of the substrate in which the higher fins are to be formed are exposed.

After the second patterned mask 126 has been patterned, the dielectric layer 124 within the trenches 120 that have been exposed is recessed. The dielectric layer 124 may be recessed by performing a plasma etch or an isotropic wet etch in a solution of a buffer oxide etch, such as a solution of hydrofluoric acid.

Figure 1F:
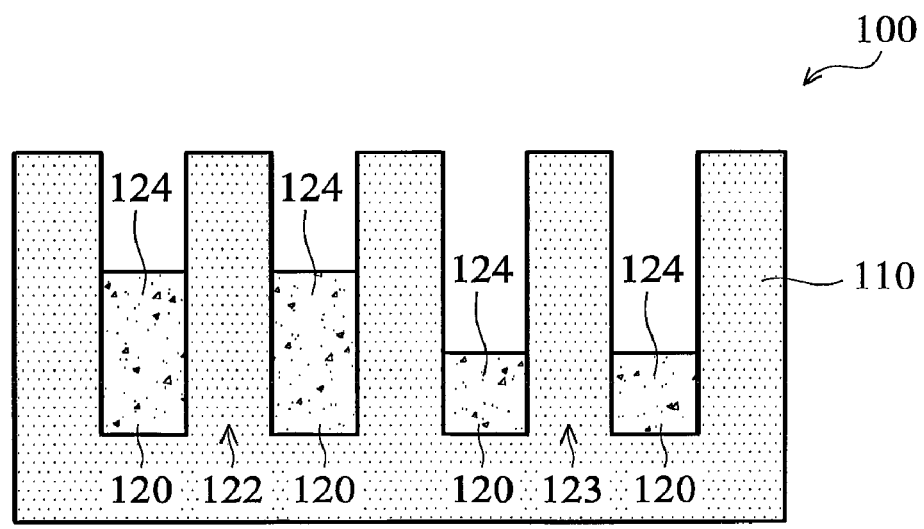

FIG. 1f illustrates the device 100 of FIG. 1e after removing the second patterned mask 126 and performing another recess process in accordance with an embodiment of the present invention. The second patterned mask 126 may be removed, for example, by an $O_2$ plasma dry strip and a mixture of concentrated sulphuric acid and hydrogen peroxide.

Thereafter, another recessing process is performed. This recessing process recesses the dielectric layer 124 within each of the trenches 120. Because the dielectric layer 124 within the trenches 120 in the region in which fins having a greater height are to be formed (illustrated along the right side of FIGS. 1a-1f) has been previously recessed, this recessing process results in trenches 120 having different heights of a dielectric layer 124 formed therein. As a result, the first fin 122 and a second fin 123 are formed having different heights. In an embodiment, the first fin 122 has a height (above the dielectric layer 124) of about 30 nm to about 80 nm, and the second fin 123 has a height of about 80 nm to about 120 nm.

Figure 2:
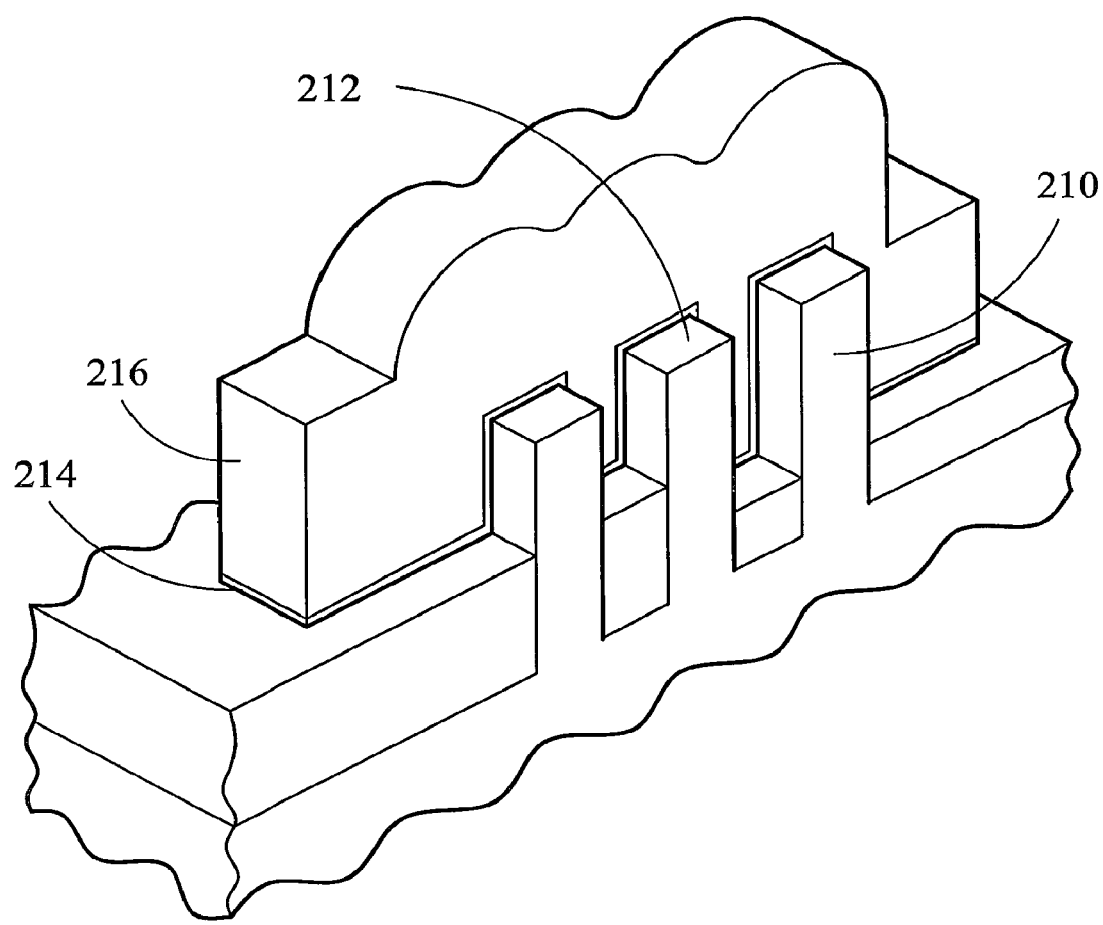
FIG. 2 illustrates a finFET in accordance with an embodiment of the present invention.

FIG. 2 illustrates a finFET device that may be formed using the process described above with reference to FIGS. 1a-1f. FIG. 2 illustrates a first fin 210 having a first height and a second fin 212 having a second height. FIG. 2 further illustrates a gate dielectric layer 214 and a gate electrode 216, which may be formed by any suitable process known in the art.

It should be noted that the embodiment illustrated in FIGS. 1a-1f and 2 illustrate the first fin 122 and the second fin 123 being formed immediately adjacent to each other (with a boundary fin therebetween) and having a single gate electrode 216 for illustrative purposes only to more simply discuss inventive features of the present invention such as forming fins having different heights. One of ordinary skill in the art will realize that other configurations are possible. In particular, the first fin and the second fin may be formed on separate portions of the substrate not adjacent to each other.

Figure 3A:
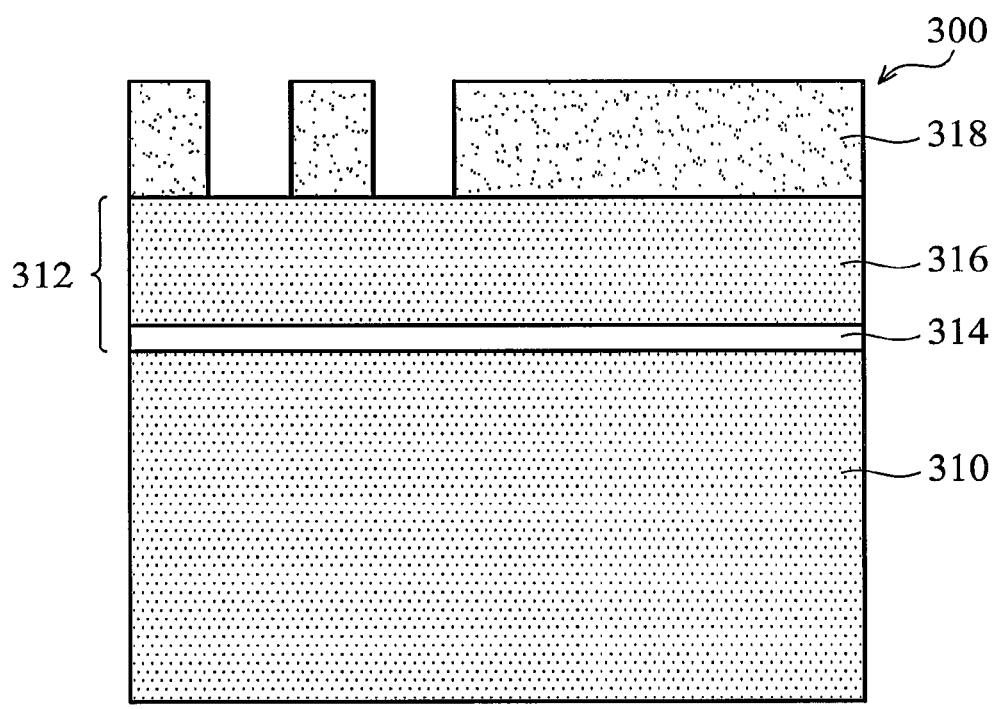
FIGS. 3a-3f are cross-section views of a wafer illustrating various process steps of forming fins having different fin heights in accordance with an embodiment of the present invention.

FIGS. 3a-3f illustrate another embodiment of the present invention in which fins of varying heights are formed in accordance with an embodiment of the present invention. Referring first to FIG. 3a, a device 300 having a substrate 310 is provided with a hard mask 312 formed thereon. The substrate 310 may comprise any semiconductor material and may comprise known structures such as those discussed above with reference to FIG. 1a. The hard mask 312 may be formed of similar materials and in a similar manner as the hard mask 112 discussed above with reference to FIG. 1a. Accordingly, the hard mask 312 may comprise an oxide layer 314 and a nitride layer 316, which may be formed of similar materials and in a similar manner as the oxide layer 114 and the nitride layer 116, respectively, discussed above with reference to FIG. 1a. In an embodiment, the oxide layer 314 is about 50 Å to about 100 Å in thickness. The nitride layer 316 has a thickness from about 3000 Å to about 4000 Å. In an alternative embodiment, the hard mask may comprise a single silicon nitride layer without an underlying oxide layer.

FIG. 3a also illustrates a first patterned mask 318. Generally, the first patterned mask 318, such as a photoresist mask, is formed on the hard mask 312 to pattern the hard mask 312 prior to patterning the underlying substrate 310. The patterned mask 318 preferably comprises a photoresist material that has been masked, exposed, and developed. The photoresist material is deposited on the surface of the hard mask 312 and irradiated (exposed) and developed to remove a portion of the photoresist material, thereby exposing portions of the hard mask 312 as illustrated in FIG. 3a.

The exposed portions of the hard mask 312 correspond to regions between adjacent fins having a first height. In the embodiment illustrated in FIGS. 3a-3f, the substrate 310 is patterned to form the shorter fins first and the larger fins second. One of ordinary skill in the art, however, will appreciate that the larger fins may be formed before the shorter fins.

Figure 3B:
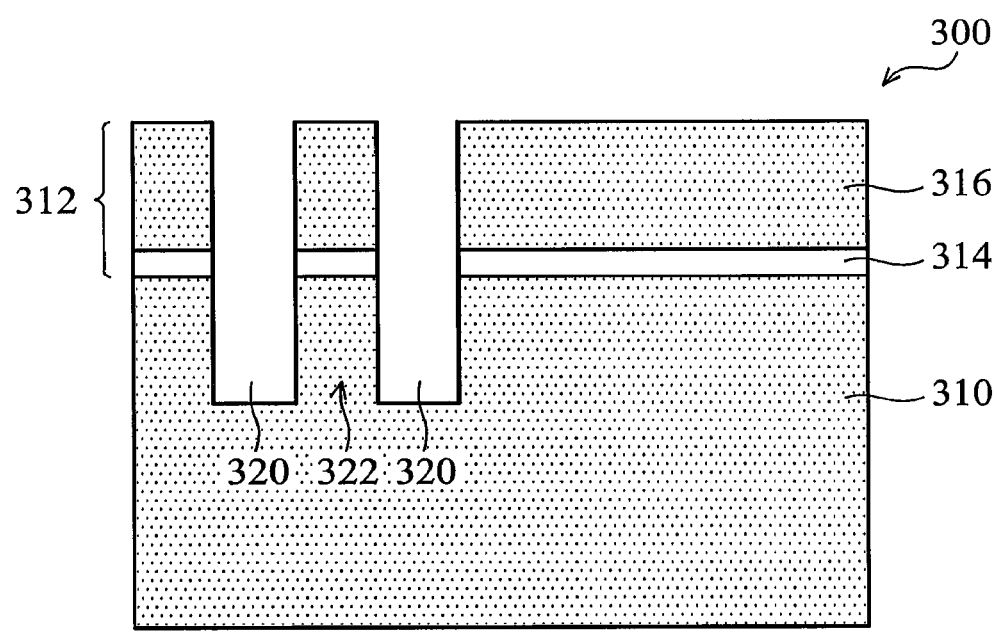

FIG. 3b illustrates the device 300 after the hard mask 312 and the substrate 310 have been patterned. The hard mask 312 and the substrate 310 may be patterned by performing one or more etching steps. For example, the nitride layer 316 may be etched using $CHF_3$ plasma, and the oxide layer 314 may be etched using $CF_4$ plasma.

Once the substrate 310 has been exposed, the silicon substrate may be etched to form a first set of trenches 320 in the substrate as illustrated in FIG. 3b. As will be discussed in greater detail below, the regions of the substrate between adjacent trenches 320 form a first fin 322. As one of ordinary skill in the art will appreciate, the depths of the first set of trenches 320 will be substantially the same due to the simultaneous etching of the trenches 320. In an embodiment, the first set of trenches 320 have a depth from about 500 Å to about 800 Å.

Also illustrated in FIG. 3b is the removal of the first patterned mask 318. The first patterned mask 318 may be removed, for example, by an $O_2$ plasma dry strip and a mixture of concentrated sulphuric acid and hydrogen peroxide.

Figure 3C:
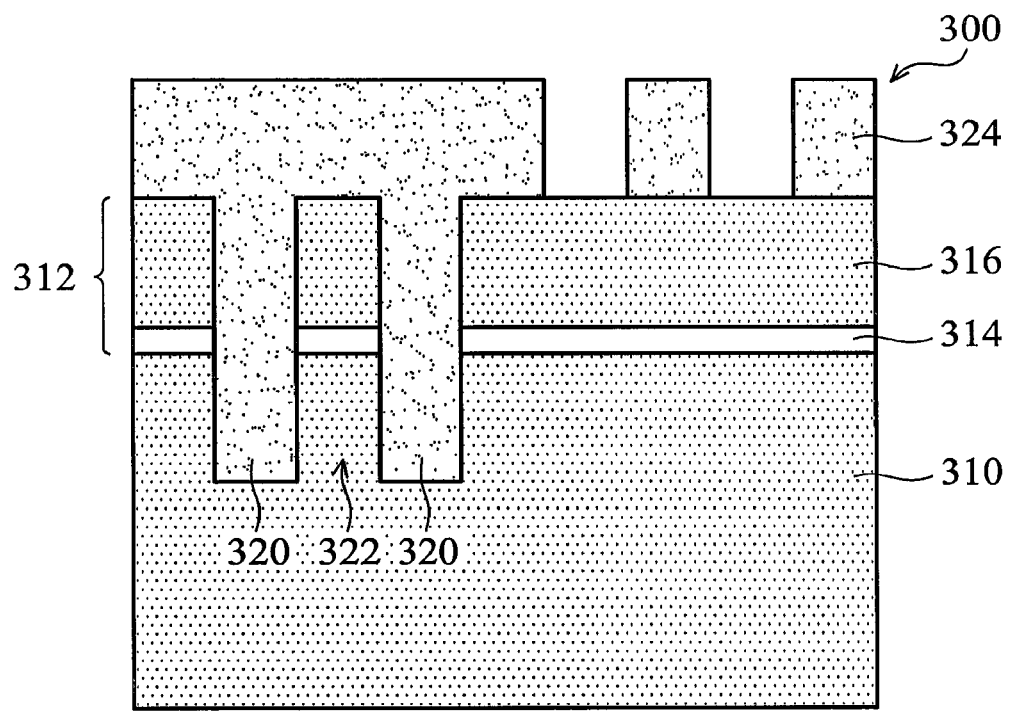

FIG. 3c illustrates the device 300 of FIG. 3b after a second patterned mask 324 has been formed and patterned. The second patterned mask 324 may be formed and patterned in a similar manner as discussed above with reference to the first patterned mask 318. The second patterned mask 324, however, is patterned for forming trenches having a second depth.

Figure 3D:
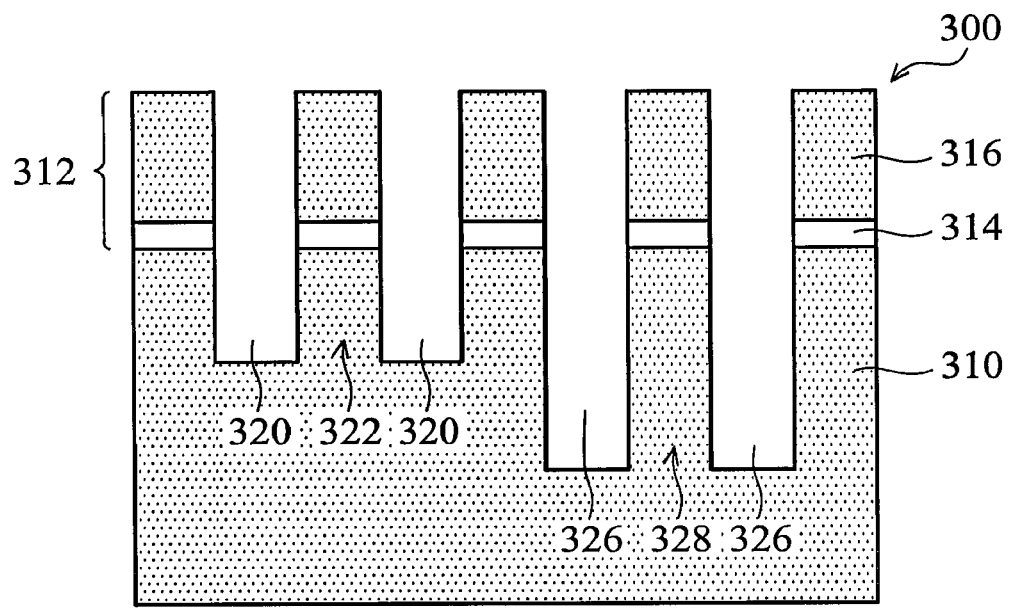

As illustrated in FIG. 3d, the second patterned mask 324 allows the formation of a second set of trenches 326 in the substrate 310 having a different depth than the first set of trenches 320, thereby allowing for the formation of a second fin 328 having a different fin height than the first fin 322.

Figure 3E:
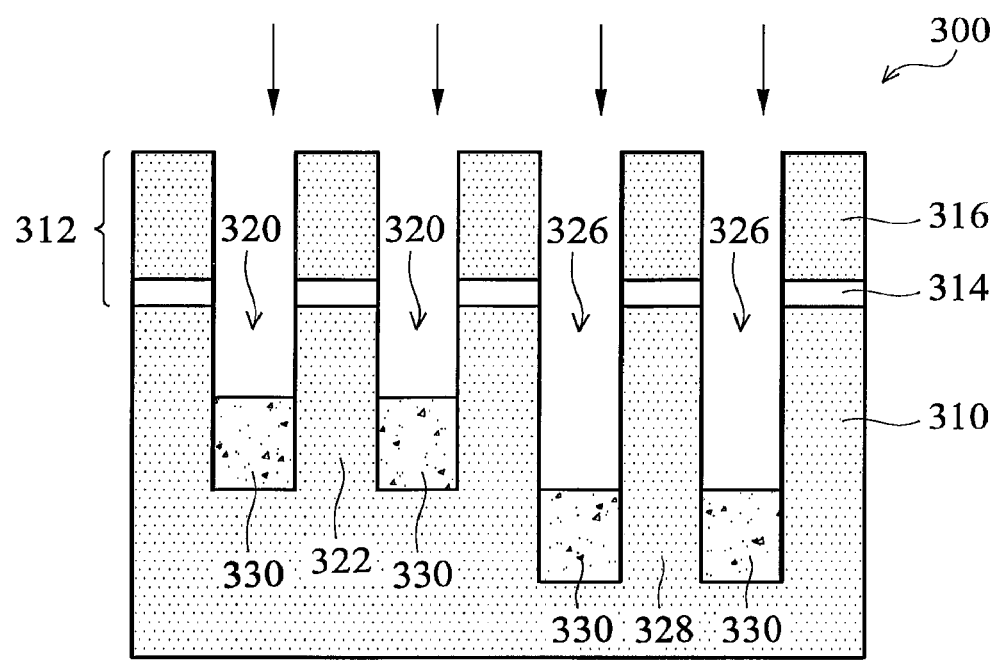

FIG. 3e illustrates device 300 of FIG. 3d after a portion of the bottom of the first set of trenches 320 and the second set of trenches 326 has been treated with an ion implant to form a dielectric material. In an embodiment, an implantation process is performed to implant oxygen, nitrogen, carbon, or the like ions into the silicon substrate 310 along the bottom of the first set of trenches 320 and the second set of trenches 326, forming dielectric regions 330. The depth of the dielectric regions 330 is controlled by the energy levels used to perform the implant. For example, in an embodiment, oxygen ions are implanted at a dose of about 1e17 to about 1e18 atoms/cm$^2$ and at an energy of about 20 KeV to about 150 KeV. In an embodiment, the dielectric regions 330 have a thickness from about 2300 Å to about 2800 Å. In an embodiment, the first fin 322 has a height (above the dielectric region 330) of about 30 nm to about 80 nm, and the second fin 328 has a height of about 80 nm to about 120 nm.

Figure 3F:
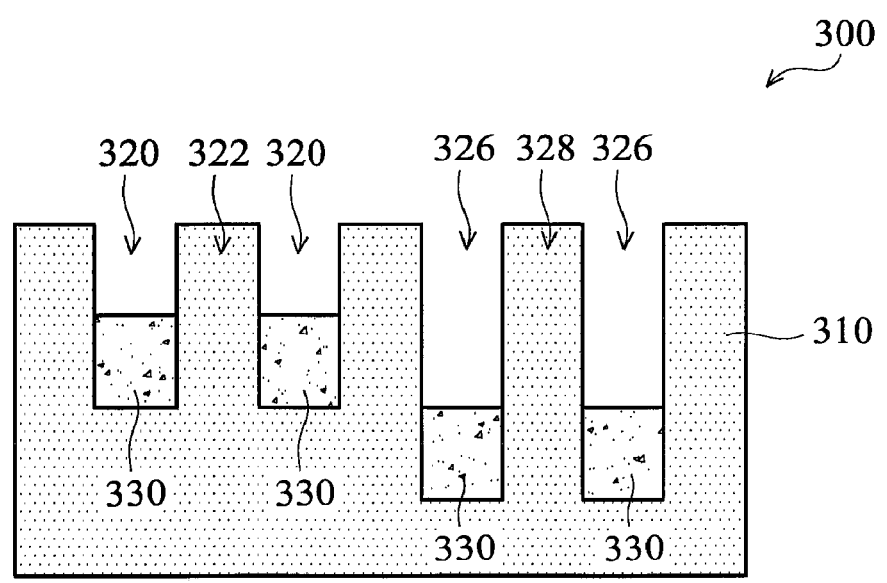

Thereafter, the hard mask 312 may be removed as illustrated in FIG. 3f. In an embodiment in which the hard mask 312 comprises the oxide layer 314 and the nitride layer 316, the oxide layer 314 may be removed using an isotropic wet etch in a solution of a buffer oxide etch, such as a solution of hydrofluoric acid and the nitride layer 316 may be removed using a wet etch in a solution of phosphoric acid.

An anneal process may also be performed to convert the doped region into a silicon dioxide to complete the oxidation process. In an embodiment, the device 300 may be annealed in an ambient of Ar, $O_2$, $O_2$/Ar mixture (preferably 1-20% $O_2$), a combination thereof, or the like with a pressure of between about 500 mTorr and about 760 mTorr and a temperature of between about 900° and about 1300° C.

Figure 4A:
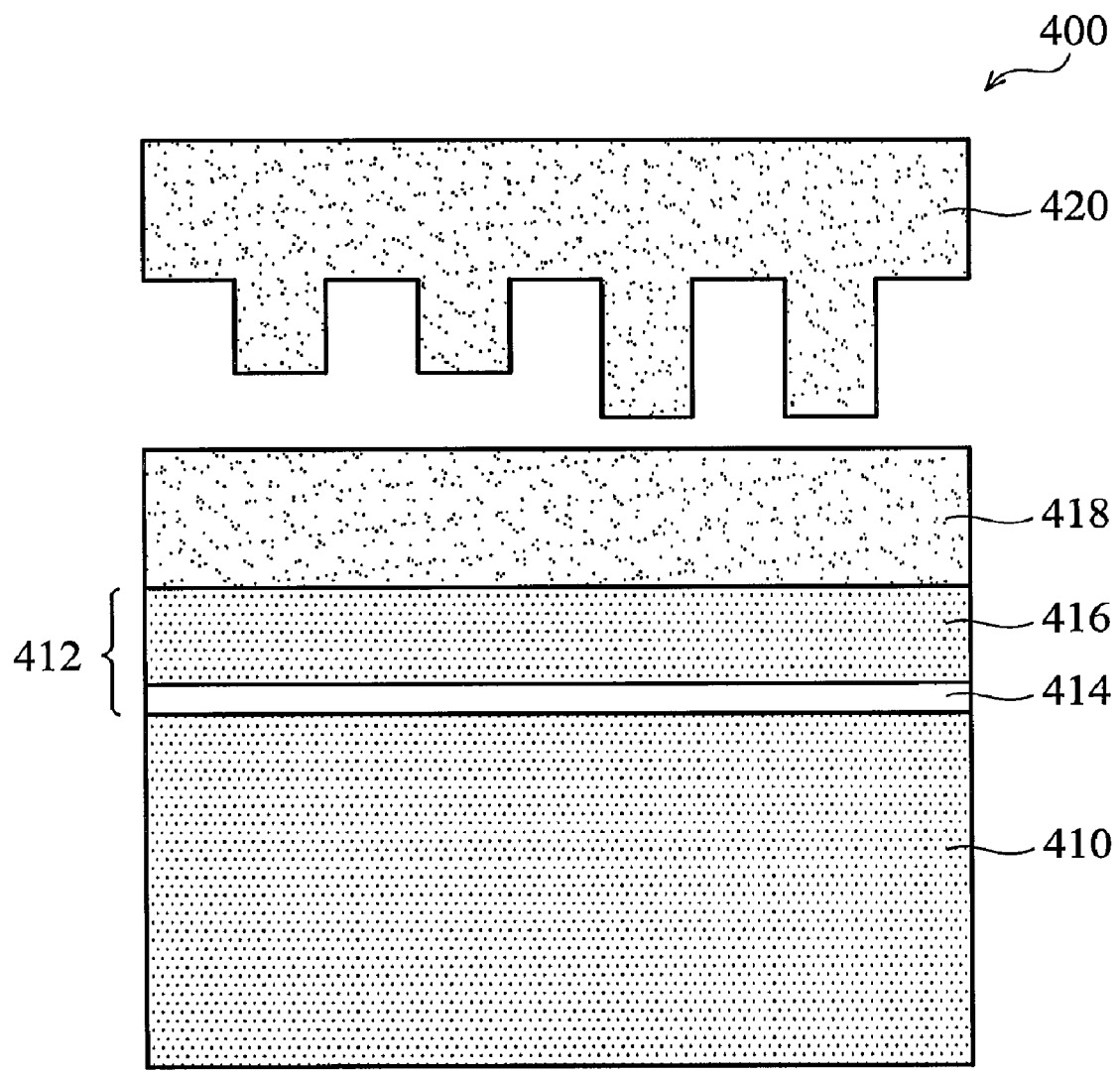
FIGS. 4a-4g are cross-section views of a wafer illustrating various process steps of forming fins having different fin heights in accordance with an embodiment of the present invention.

FIGS. 4a-4g illustrate another embodiment of the present invention in which fins of varying heights are formed. Referring first to FIG. 4a, a device 400 having a substrate 410 is provided with a hard mask 412 formed thereon. The substrate 410 may comprise any semiconductor material, including those discussed above with reference to FIG. 1a. The hard mask 412 may be formed of similar materials and in a similar manner as the hard mask 312 discussed above with reference to FIG. 3a. Accordingly, the hard mask 412 may comprise an oxide layer 414 and a nitride layer 416, which may be formed of similar materials and in a similar manner as the oxide layer 314 and the nitride layer 316, respectively, discussed above with reference to FIG. 3a. In an alternative embodiment, the hard mask may comprise a single silicon nitride layer without an underlying oxide layer.

Figure 4B:
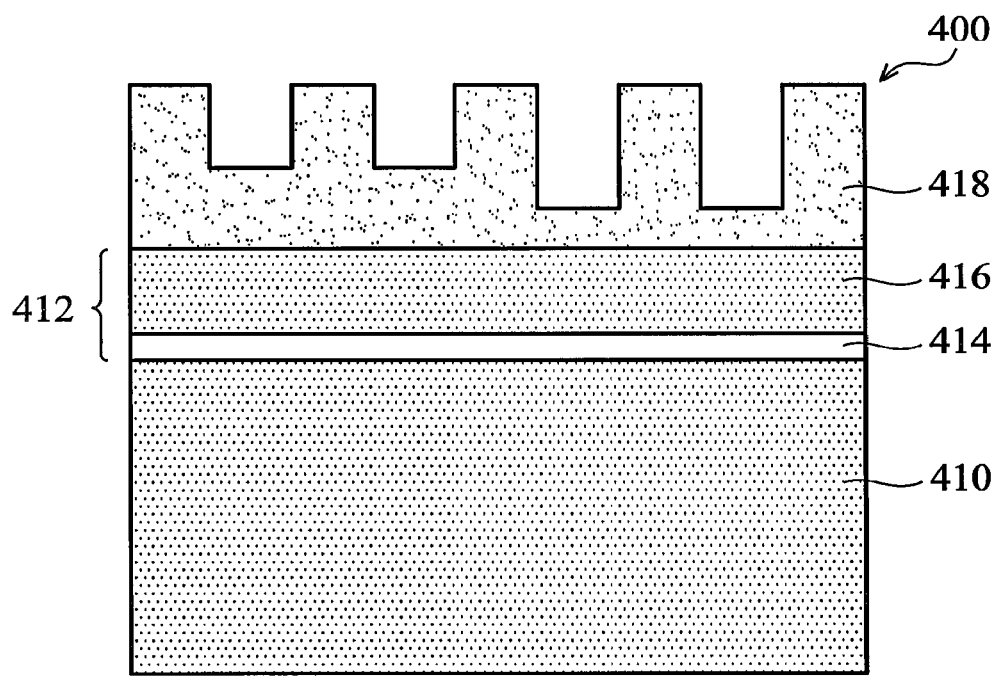

FIG. 4a further illustrates a first mask layer 418 overlying the hard mask 412 in accordance with an embodiment of the present invention. In an embodiment, the first mask layer 418 is a photoresist layer. The photoresist layer may be patterned by using an imprint mold 420. The imprint mold 420 imprints a pattern in the first mask layer 418 as illustrated in FIG. 4b. As one of ordinary skill in the art will appreciate, the first mask layer 418 is imprinted with trenches having different depths. As will be discussed in greater detail below, the trench having different depths correspond to fins having different heights.

Figure 4C:
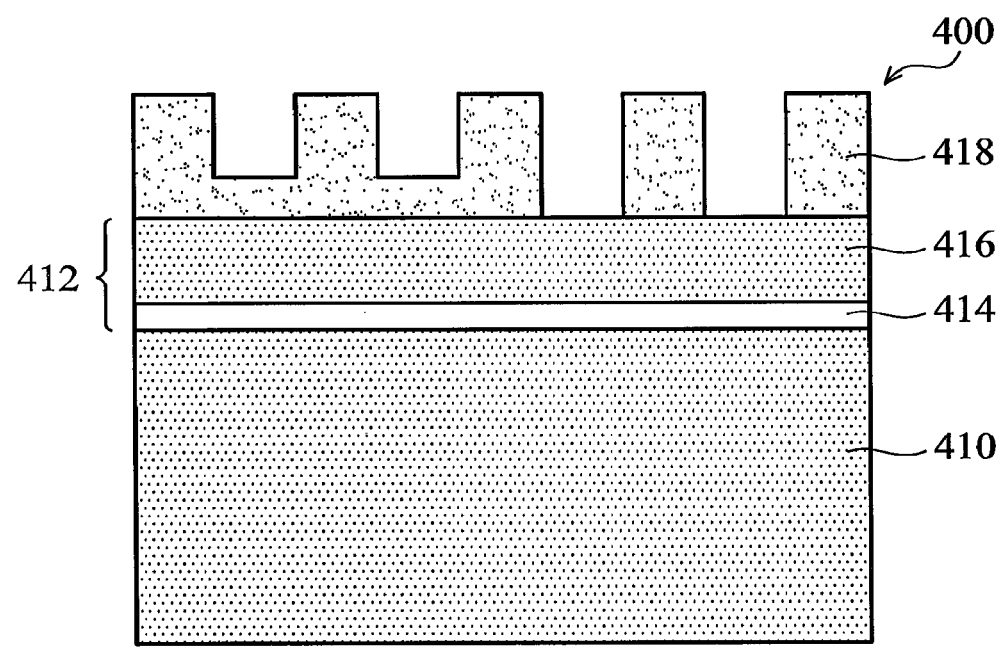

FIG. 4c illustrates the device 400 after performing a first etch process to remove portions of the first mask layer 418 to expose portions of the hard mask 412 corresponding to the deeper trenches formed in the first mask layer 418. The first mask layer 418 may be etched using a dry etch process with $N_2/H_2$, $NH_3$, $N_2/O_2$, $CO/O_2$ plasma, or the like.

Figure 4D:
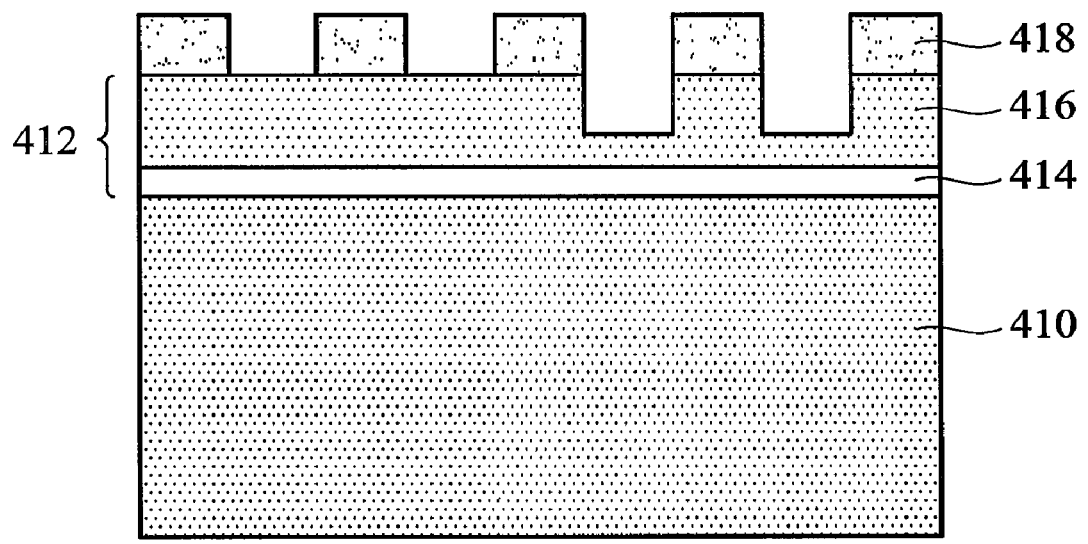

Thereafter, one or more dry etch processes may be used to remove exposed portions of the hard mask 412. It should be noted that the one or more dry etch processes may also remove portions of the first mask layer 418 as well as part of the nitride layer 416, as illustrated in FIG. 4d.

The one or more etching processes continue until a first set of trenches 422 and a second set of trenches 424 are formed in the substrate 410. The hard mask 412 may be etched, for example, using a dry etch process with $CHF_3/O_2$ plasma and substrate 410 may be etched, for example, with $HBr/O_2$, $Cl_2/O_2$, or $SF_6/O_2$ plasma. Because the first mask layer 418 (FIG. 4b) was imprinted with trenches having a different height, the first set of trenches 422 and the second set of trenches 424 are formed having different depths, thereby creating a first fin 423 and a second fin 425 having different heights. In an embodiment, the first fin 423 has a height of about 80 nm to about 120 nm, and the second fin 425 has a height of about 30 nm to about 80 nm.

Figure 4E:
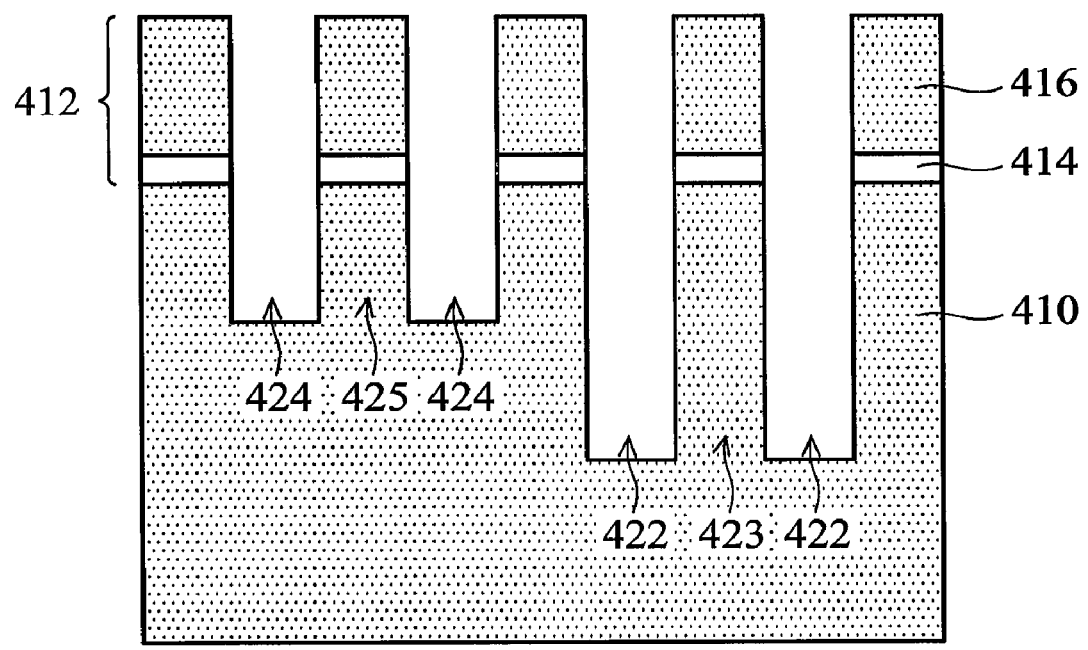
Figure 4F:
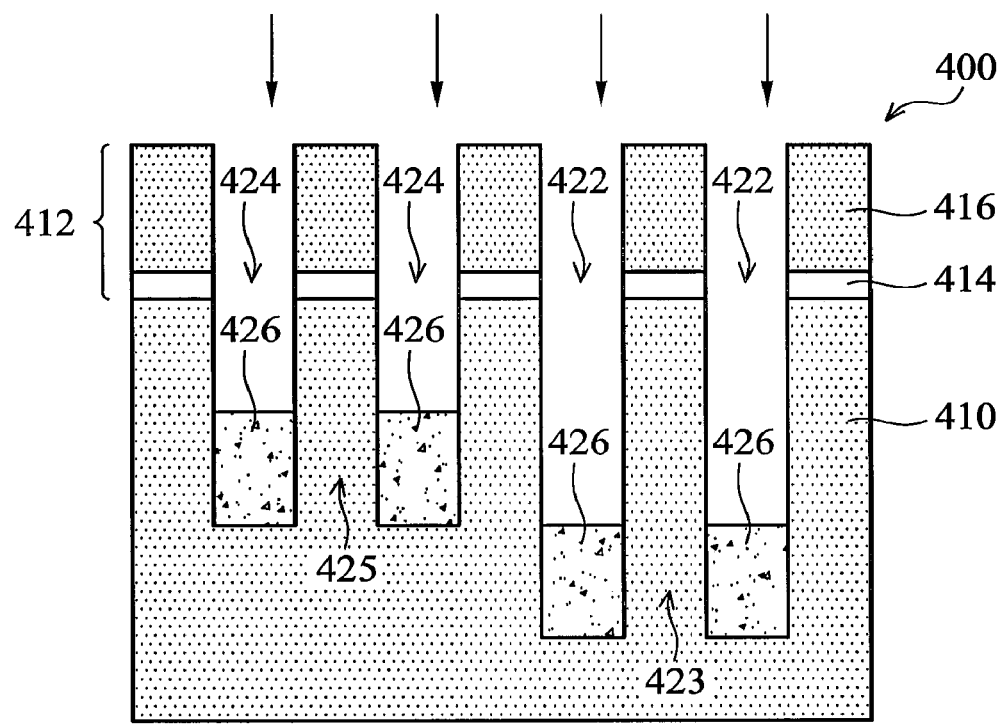

FIG. 4f illustrates device 400 of FIG. 4e after a portion of the bottom of the first set of trenches 422 and the second set of trenches 424 has been transformed into a dielectric material in accordance with an embodiment of the present invention. In an embodiment, an implantation process is performed to implant oxygen, nitrogen, carbon, or the like ions into the silicon substrate 410 along the bottom of the first set of trenches 422 and the second set of trenches 424, forming dielectric regions 426. In an embodiment, the substrate 410 is doped with $O_2$ ions at a dose of about 1E17 to about 1E18 atoms/cm2 and at an energy of about 20 KeV to about 150 KeV. In an embodiment, the dielectric regions 426 have a thickness from about 2300 Å to about 2800 Å.

Figure 4G:
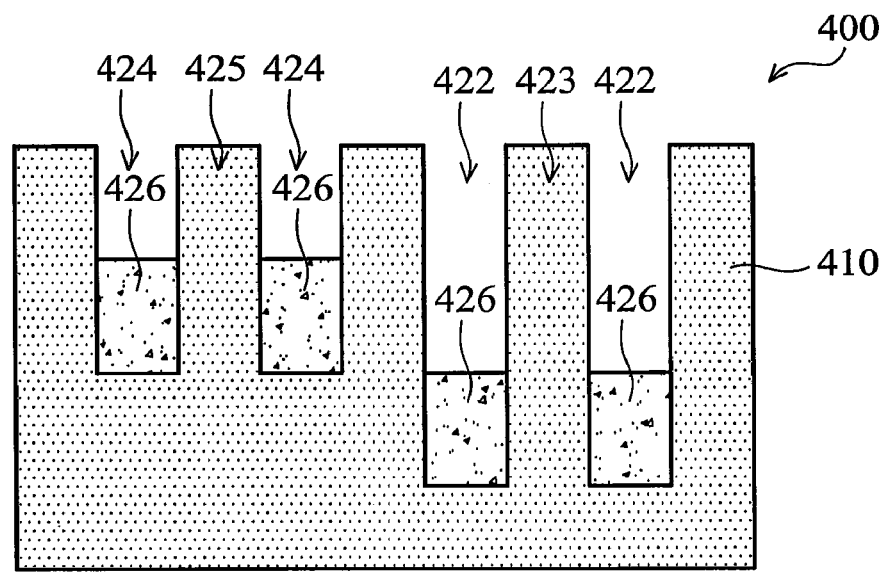

Thereafter, the hard mask 412 may be removed as illustrated in FIG. 4g. In an embodiment in which the hard mask 412 comprises the oxide layer 414 and the nitride layer 416, the oxide layer 414 may be removed using an isotropic wet etch in a solution of a buffer oxide etch, such as a solution of hydrofluoric acid and the nitride layer 416 may be removed using a wet etch in a solution of phosphoric acid.

An anneal process may also be performed to convert the doped region into a silicon dioxide to complete the oxidation process. In an embodiment, the device 400 may be annealed in an ambient of Ar, $O_2$, $O_2$/Ar mixture (preferably 1-20% $O_2$), a combination thereof, or the like with a pressure of between about 500 mTorr and about 760 mTorr and a temperature of between about 900° and about 1300° C.

Figure 5A:
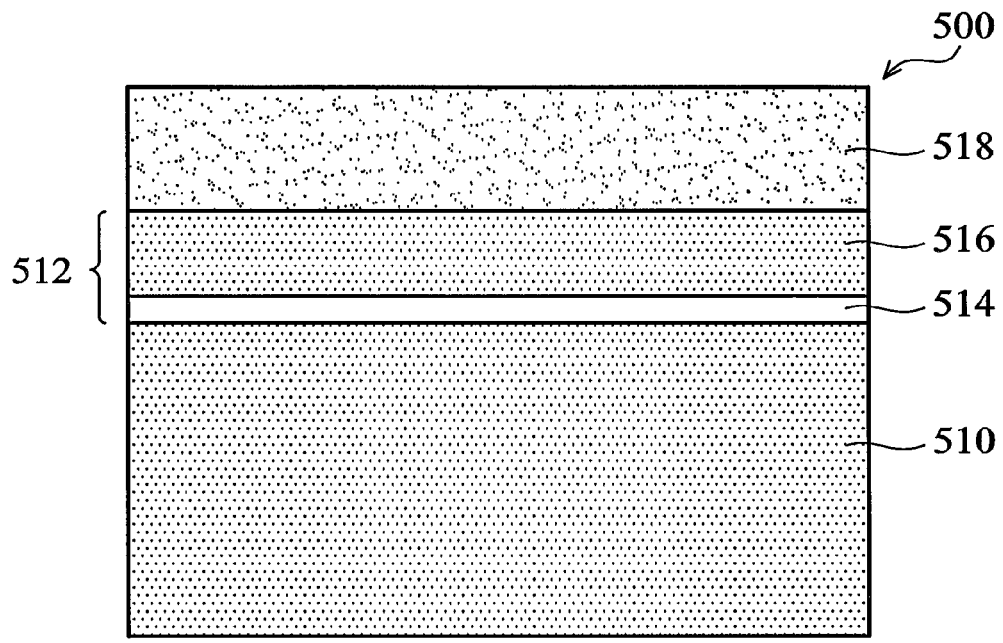
FIGS. 5a-5f are cross-section views of a wafer illustrating various process steps of forming fins having different fin heights in accordance with an embodiment of the present invention.

FIGS. 5a-5g illustrate yet another embodiment of the present invention in which fins of varying heights are formed in accordance with an embodiment of the present invention. Referring first to FIG. 5a, a device 500 having a substrate 510 is provided with a hard mask 512 formed thereon. The substrate 510 may comprise any semiconductor material and may comprise known structures including a graded layer or a buried oxide, for example. In an embodiment, the substrate 510 comprises bulk silicon that may be undoped or doped (e.g., p-type, n-type, or a combination thereof). Other materials that are suitable for semiconductor device formation may be used. In a preferred embodiment, however, the substrate 510 is bulk silicon.

The hard mask 512 may be formed of similar materials and in a similar manner as the hard mask 312 discussed above with reference to FIG. 3a. Accordingly, the hard mask 512 may comprise an oxide layer 514 and a nitride layer 516, which may be formed of similar materials and in a similar manner as the oxide layer 314 and the nitride layer 316, respectively, discussed above with reference to FIG. 3a. In an alternative embodiment, the hard mask may comprise a single silicon nitride layer without an underlying oxide layer.

Figure 5B:
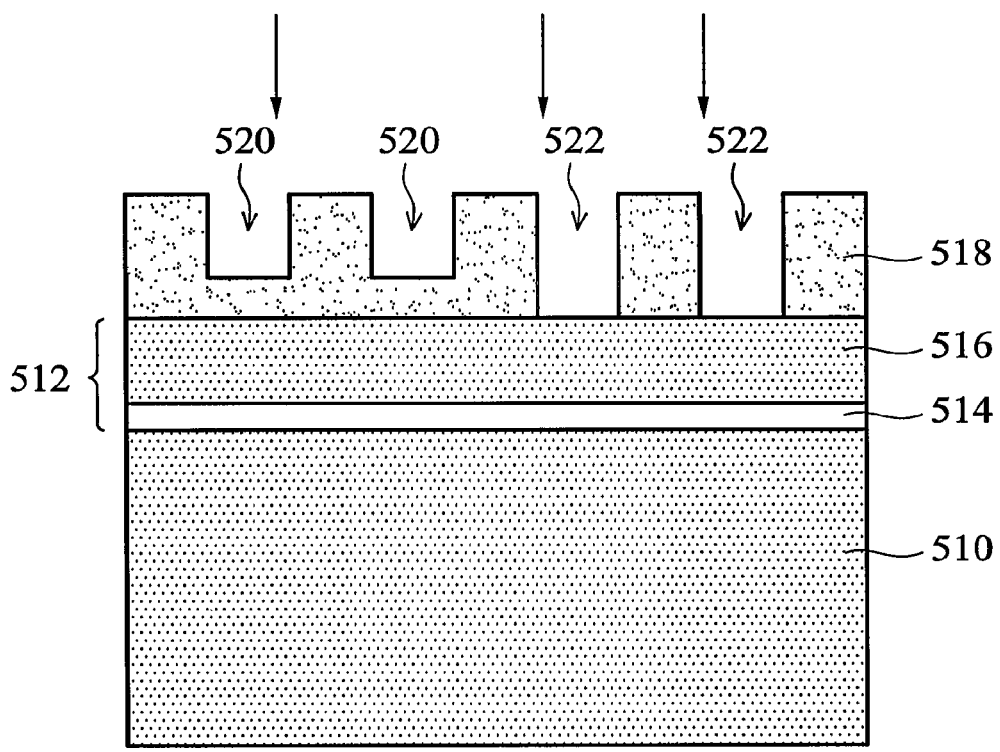

FIG. 5a further illustrates a first mask layer 518 overlying the hard mask 512. In an embodiment, the first mask layer 518 is a photoresist layer. The photoresist layer may be patterned by using e-beam lithography by varying the amount of energy to form patterned trenches 520 and 522 as illustrated in FIG. 5b. In this manner, a lower amount of energy may be used to create the shallow trenches in the first mask layer 518, such as the trenches 520 along the left side of FIG. 5b, and a higher amount of energy may be used to create deeper trenches in the first mask layer 518, such as the trenches 522 along the right side of FIG. 5b.

In an embodiment, e-beam lithography is used at an energy of about 50 KeV to about 100 KeV to form the shallow trenches 520 along the left side of FIG. 5b having a depth of about 3000 Å to about 4000 Å, and an energy of about 75 KeV to about 125 KeV to form the deeper trenches 522 along the right side of FIG. 5b having a depth of about 3500 Å to about 4500 Å.

Figure 5C:
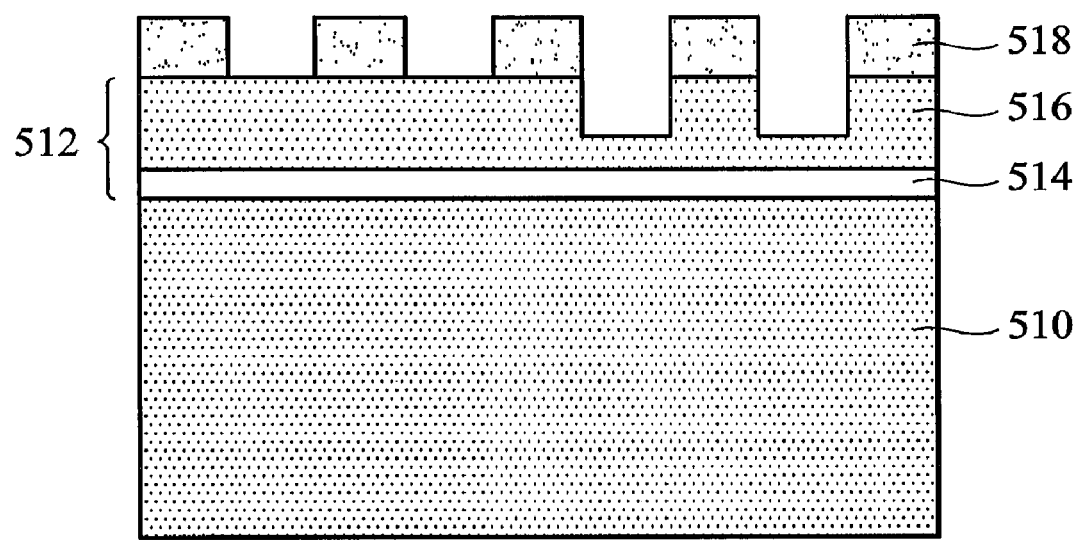

FIG. 5c illustrates the device 500 after performing a first etch process to remove portions of the hard mask 512 and the underlying substrate 510. The first etch process may be performed using a dry etch process with $CHF_3/O_2$ plasma, or the like to etch portions of the hard mask 512 and the first mask layer 518.

Figure 5D:
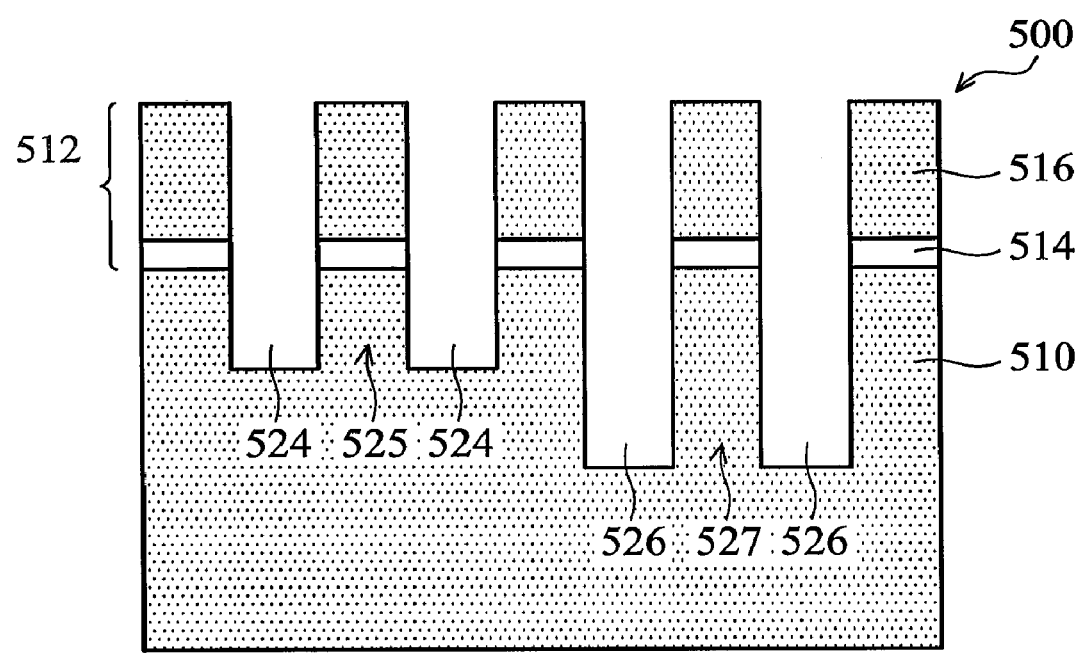

The one or more etching processes continue until a first set of trenches 524 and a second set of trenches 526 are formed in the substrate 510 as illustrated in FIG. 5d. Because the first mask layer 518 (FIGS. 5b-5c) was patterned with trenches having different heights, the first set of trenches 524 and the second set of trenches 526 are formed having different depths, thereby forming a first fin 525 and a second fin 527 having different heights. In an embodiment, the first fin 525 has a height (above a dielectric layer 528) of about 30 nm to about 80 nm, and the second fin 527 has a height of about 80 nm to about 120 nm.

Figure 5E:
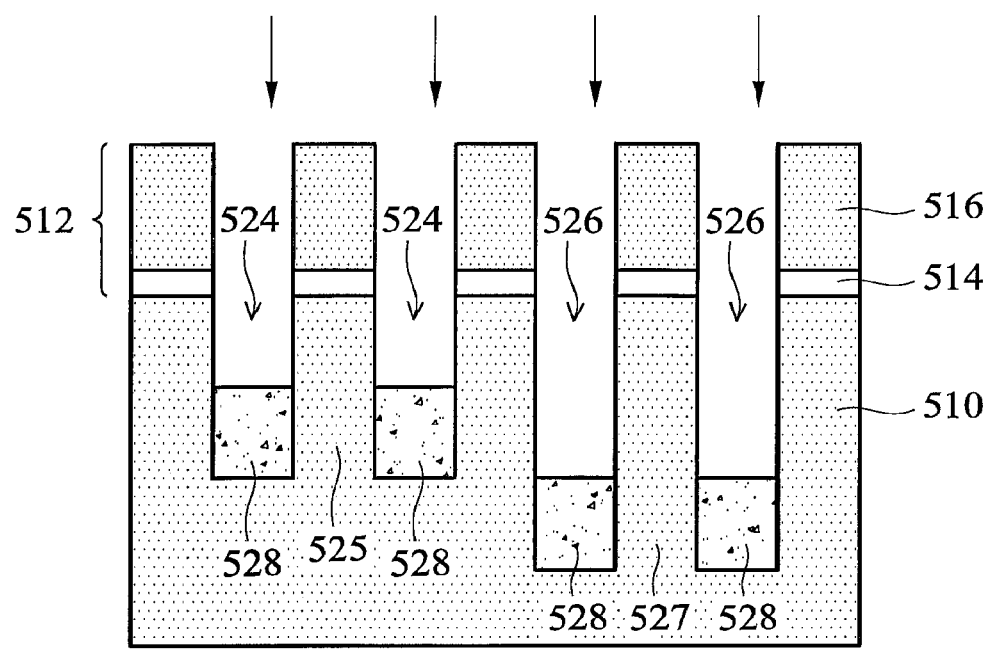

FIG. 5e illustrates the device 500 of FIG. 5e after dielectric regions 528 have been formed along the bottom of the first set of trenches 524 and the second set of trenches 526. In an embodiment, an implantation process is performed to implant oxygen, nitrogen, carbon, or the like ions into the silicon substrate 510 along the bottom of the first set of trenches 524 and the second set of trenches 526, forming dielectric regions 528. In an embodiment, the substrate 510 is doped with $O_2$ ions at a dose of about 1e17 to about 1e18 atoms/cm2 and at an energy of about 20 KeV to about 150 KeV. In an embodiment, the oxidized regions 528 have a thickness from about 2300 Å to about 2800 Å.

Figure 5F:
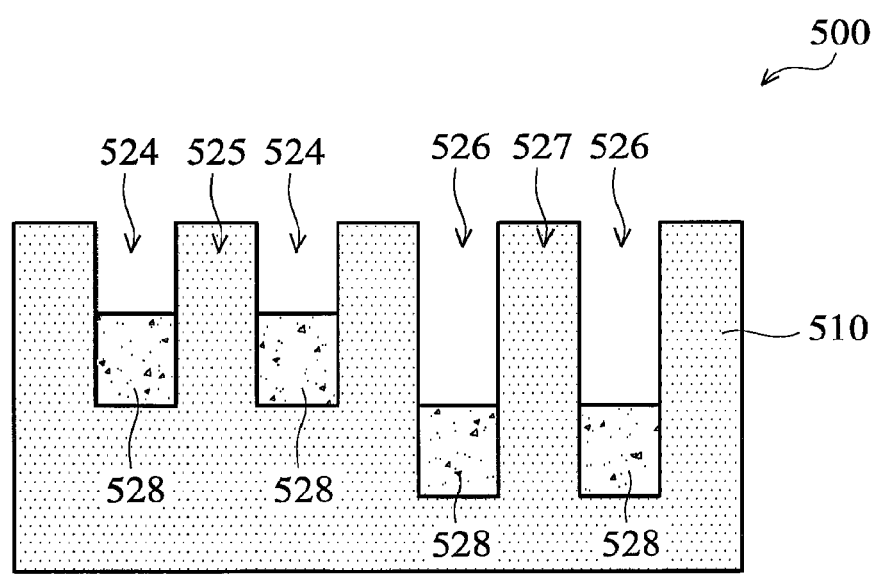

Thereafter, the hard mask 512 may be removed as illustrated in FIG. 5f. In an embodiment in which the hard mask 512 comprises the oxide layer 514 and the nitride layer 516, the oxide layer 514 may be removed using an isotropic wet etch in a solution of a buffer oxide etch, such as a solution of hydrofluoric acid and the nitride layer 516 may be removed using a wet etch in a solution of phosphoric acid.

An anneal process may also be performed to convert the doped region into a silicon dioxide to complete the oxidation process. In an embodiment, the device 500 may be annealed in an ambient of Ar, $O_2$, $O_2$/Ar mixture (preferably 1-20% $O_2$) with a pressure of between about 500 mTorr and about 760 mTorr and a temperature of between about 900° and about 1300° C.

Figure 6:
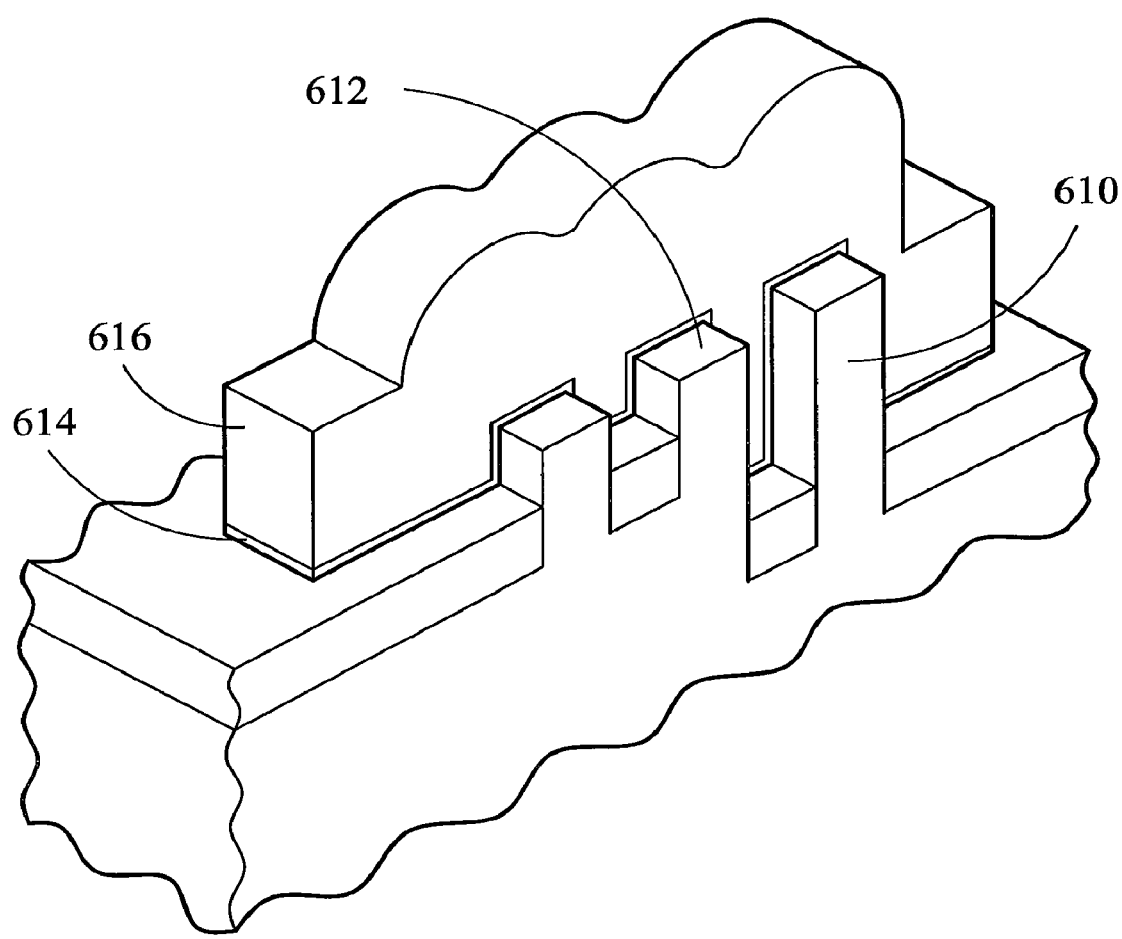
FIG. 6 illustrates a finFET in accordance with an embodiment of the present invention.

FIG. 6 illustrates a finFET that may be formed using the embodiments discussed above with reference to FIGS. 3a-3f, FIGS. 4a-4g, and FIGS. 5a-5f FIG. 6 illustrates a first fin 610 having a first height and a second fin 612 having a second height. FIG. 6 further illustrates a gate dielectric layer 614 and a gate layer 616, which may be formed by any suitable process known in the art.

It should be noted that the embodiment illustrated in FIGS. 3a-3f, 4a-4g, 5a-5f, and 6 illustrate the first fin 610 and the second fin 612 being formed immediately adjacent to each other (with a boundary fin therebetween), and FIG. 6 illustrates having a single gate electrode 616 for illustrative purposes only to more simply discuss inventive features of the present invention such as forming fins having different heights. One of ordinary skill in the art will realize that other configurations are possible. In particular, the first fin 610 and the second fin 612 may be formed on separate portions of the substrate not adjacent to each other.

It should also be noted that embodiments of the present invention described herein (see, e.g., FIG. 4D and FIG. 5E) may be utilized to form finFET devices such that the first fin 610 and the second fin 612 may be formed such that the boundary fin width can be less than about 30 nm without being impacted by overlay alignment requirements as in FIG. 1E and FIG. 3C, thereby allowing further scaling of the semiconductor devices.

One of ordinary skill in the art will appreciate that the embodiment illustrated in FIG. 2 utilizes a uniform trench depth, but different thicknesses of a dielectric material within the trenches are used to form fins having different heights. In contrast, the embodiment illustrated in FIG. 6 utilizes different trench depths and a uniform thickness of a dielectric material within the trenches to achieve fins having different heights.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular illustrative embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding illustrative embodiments described herein may be utilized according to the present invention. Accordingly, the appended claims are intended to include within their scope such processes, machines, manufacture, compositions of matter, means, methods, or steps.

What is claimed is:

1. A method of forming fins for a semiconductor device, the method comprising:
    providing a substrate;
    forming one or more mask layers over the substrate;
    patterning the one or more mask layers to form a first set of adjacent trenches and a second set of adjacent trenches in the one or more mask layers, the first set of adjacent trenches having a first depth and the second set of adjacent trenches having a second depth, the second depth being different than the first depth;
    simultaneously transferring the pattern of the first set of adjacent trenches and the second set of adjacent trenches in the one or more mask layers into the substrate, thereby forming a third set of adjacent trenches and a fourth set of adjacent trenches corresponding to the first set of adjacent trenches and the second set of adjacent trenches, respectively; and
    forming a dielectric layer along a bottom of the first set of adjacent trenches and the second set of adjacent trenches, the dielectric layer along the bottom of the first set of adjacent trenches and the second set of adjacent trenches being substantially the same.

2. The method of claim 1, wherein the substrate is a bulk silicon substrate.

3. The method of claim 1, wherein the one or more mask layers include a first mask layer over the substrate, a second mask layer over the first mask layer, and a photoresist layer over the second mask layer.

4. The method of claim 3, wherein the first mask layer is an oxide layer and the second mask layer is a nitride layer.

5. The method of claim 1, wherein the patterning one or more mask layers includes using an e-beam lithography with varying amounts of energy.

6. The method of claim 1, wherein the patterning the one or more mask layers includes using an imprint mold.

7. The method of claim 1, wherein the forming the dielectric layer is performed at least in part by implantation.

8. The method of claim 7, wherein the implantation includes implanting oxygen, nitrogen, or carbon ions.

9. The method of claim 1, wherein the simultaneously transferring comprises:
    etching the one or more mask layers to expose portions of the substrate along the bottom of the second set of adjacent trenches, the substrate not being exposed along the bottom of the first set of adjacent trenches;
    etching the one or more mask layers to expose portions of the substrate along the bottom of the first set of adjacent trenches while etching exposed portions of the substrate along the bottom of the second set of adjacent trenches; and
    etching exposed portions of the substrate along the bottom of the first set of adjacent trenches and the second set of adjacent trenches.

10. The method of claim 9, wherein the one or more mask layers include an oxide mask layer over the substrate, a nitride mask layer over the oxide mask layer, and a photoresist layer over the nitride mask layer.

11. The method of claim 9, wherein the patterning the one or more mask layers includes using an e-beam lithography with varying amounts of energy.

12. The method of claim 9, wherein the patterning the one or more mask layers includes using an imprint mold.

13. The method of claim 9, wherein the forming the dielectric layer comprises implanting oxygen, nitrogen, or carbon ions.

* * * * *